US 12,277,982 B2

(12) United States Patent
Lindskog et al.

(10) Patent No.: US 12,277,982 B2
(45) Date of Patent: Apr. 15, 2025

(54) VERIFIABLE ONE-TIME PROGRAMMABLE MEMORY DEVICE

(71) Applicant: Telefonaktiebolaget LM Ericsson (publ), Stockholm (SE)

(72) Inventors: Niklas Lindskog, Lund (SE); Håkan Englund, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 152 days.

(21) Appl. No.: 18/021,842

(22) PCT Filed: Aug. 26, 2020

(86) PCT No.: PCT/EP2020/073889
§ 371 (c)(1),
(2) Date: Feb. 17, 2023

(87) PCT Pub. No.: WO2022/042836
PCT Pub. Date: Mar. 3, 2022

(65) Prior Publication Data
US 2023/0317187 A1    Oct. 5, 2023

(51) Int. Cl.
*G11C 17/16* (2006.01)
*G11C 17/18* (2006.01)

(52) U.S. Cl.
CPC .............. *G11C 17/18* (2013.01); *G11C 17/16* (2013.01)

(58) Field of Classification Search
CPC ........... G11C 17/18; G11C 17/16; G11C 8/12; G11C 11/005; G11C 17/146
USPC ............................ 365/96, 189.05
See application file for complete search history.

(56) References Cited

U.S. PATENT DOCUMENTS

| 6,690,193 B1 | 2/2004 | Heinzer et al. |
| 8,032,727 B2 | 10/2011 | Brownhill et al. |
| 8,122,307 B1 | 2/2012 | Lindhorst et al. |

(Continued)

FOREIGN PATENT DOCUMENTS

| EP | 2919236 A1 | 9/2015 |
| KR | 20180006521 A | 1/2018 |

OTHER PUBLICATIONS

International Search Report and Written Opinion of the International Searching Authority, PCT/EP2020/073889, mailed Apr. 23, 2021, 10 pages.

*Primary Examiner* — Michael T Tran
(74) *Attorney, Agent, or Firm* — Sage Patent Group

(57) ABSTRACT

There is provided a verifiable OTP memory device, the memory device including an MTP memory block and an OTP memory block for storing data, and a memory controller. The memory controller is configured to handle write requests and read requests. Each write request and read request pertains to writing data to, and reading data from, respectively, a requested position in either the MTP memory block or the OTP memory block. The memory controller is configured to, in response to the write requests, write the data to the requested position in either the MTP memory block or the OTP memory block. The memory controller is configured to, in response to the read requests, output data as combined from the requested position in the MTP memory block and the requested position in the OTP memory block, regardless if the read requests are for the MTP memory block or the OTP memory block.

17 Claims, 14 Drawing Sheets

(56) References Cited

U.S. PATENT DOCUMENTS

| | | | |
|---|---|---|---|
| 8,861,250 B1* | 10/2014 | Wu | G11C 17/12 365/185.21 |
| 9,019,742 B2 | 4/2015 | Chung | |
| 9,135,978 B2 | 9/2015 | Kuniharo | |
| 9,449,709 B1 | 9/2016 | Li et al. | |
| 9,767,318 B1 | 9/2017 | Dropps | |
| 10,133,767 B1* | 11/2018 | Cole | G06F 16/2329 |
| 10,176,418 B1* | 1/2019 | Osborn | G06K 19/073 |
| 10,664,941 B1* | 5/2020 | Osborn | G06Q 20/40145 |
| 10,684,966 B1* | 6/2020 | Hamman | G06F 13/1668 |
| 10,701,560 B1* | 6/2020 | Lerner | G06Q 20/3829 |
| 10,742,414 B1* | 8/2020 | Wieker | G06F 21/44 |
| 2004/0222817 A1* | 11/2004 | Madurawe | H01L 27/118 326/39 |
| 2005/0253624 A1* | 11/2005 | Hsu | G11C 17/18 326/38 |
| 2007/0030026 A1* | 2/2007 | Hsu | G11C 17/16 326/38 |
| 2011/0066272 A1* | 3/2011 | Anpo | B82Y 40/00 700/103 |
| 2011/0222330 A1* | 9/2011 | Lee | G11C 17/18 365/100 |
| 2012/0314472 A1* | 12/2012 | Chung | G11C 13/0007 365/158 |
| 2014/0063895 A1* | 3/2014 | Li | G11C 17/16 365/97 |
| 2014/0071726 A1* | 3/2014 | Chung | G11C 17/16 365/49.17 |
| 2015/0036428 A1* | 2/2015 | Liu | G11C 16/0416 365/185.03 |
| 2015/0095728 A1* | 4/2015 | Lu | G11C 29/006 714/721 |
| 2015/0129666 A1* | 5/2015 | Butler | G06K 19/073 235/492 |
| 2015/0130506 A1 | 5/2015 | Bhunia et al. | |
| 2015/0318043 A1* | 11/2015 | Chishti | G11C 17/14 365/185.21 |
| 2015/0324122 A1* | 11/2015 | Kaminaga | G06F 3/0652 711/103 |
| 2015/0378627 A1* | 12/2015 | Kitazawa | G06F 21/6209 711/162 |
| 2016/0026783 A1 | 1/2016 | Buer et al. | |
| 2016/0055920 A1 | 2/2016 | Lee | |
| 2017/0257222 A1 | 9/2017 | Pedersen et al. | |
| 2017/0270323 A1* | 9/2017 | Butler | G06K 19/07749 |
| 2020/0219574 A1* | 7/2020 | Chung | G11C 13/0002 |
| 2020/0242022 A1* | 7/2020 | Subramanian | G06F 9/544 |
| 2020/0251143 A1* | 8/2020 | Nangare | G11B 20/10472 |
| 2021/0398579 A1* | 12/2021 | Lee | G11C 11/1657 |
| 2022/0328504 A1* | 10/2022 | Lee | H10B 20/20 |

* cited by examiner

VERIFIABLE ONE-TIME PROGRAMMABLE MEMORY DEVICE

CROSS REFERENCE TO RELATED APPLICATIONS

This application is a 35 U.S.C. § 371 national stage application of PCT International Application No. PCT/EP2020/073889 filed on Aug. 26, 2020, the disclosure and content of which is incorporated by reference herein in its entirety.

TECHNICAL FIELD

Embodiments presented herein relate to a verifiable one-time programmable (OTP) memory device, methods, a computer program, and a computer program product for handling a write request in the verifiable OTP memory device and/or handling a read request in the verifiable OTP memory device.

BACKGROUND

In general terms, an OTP memory is a special type of non-volatile memory (NVM) that permits data to be written to memory only once. Once the memory has been programmed, it retains its value upon loss of power (i.e., is non-volatile). An OTP memory is thus a memory type which can only be programmed once, after which it is locked in a programmed state for the rest of its life cycle. OTP memories can be used in applications where reliable and repeatable reading of data is required. Examples include boot code and configuration parameters for analog, sensor or display circuitry. OTP memories can be used to enforce permanent device options such as: disable debug interfaces, enable boot from external interfaces, require authentication to access a device, disable further programming of any other OTP bits etc. OTP memories can also be used to store cryptographic keys which needs to be present across power cycles. They can furthermore be utilized for rollback protection and version control. OTP memories can be embodied using different technical solutions. A common implementation is electrically programmable fuses such as eFuses and anti-fuses.

NVMs that are not of OTP type, also known as multiple-time programmable (MTP) memories, are built to retain its state even after the power source is disconnected. A common variant of MTP is flash memory.

One similarity between MTP and OTP memories is that they are both designed to retain the state they had when they were powered on. The difference, however, is that in an MTP, the state may be changed several times during its lifetime, whereas an OTP memory, on the other hand, can be programmed only once (on a bit by bit granularity) after which it retains its programmed state for the entire lifetime of the device.

OTP memories are powerful tools to boost security and force the device to operate in a pre-determined manner. Nevertheless, it is not possible to directly test the configuration prior to permanently altering the device. Further in this respect, programming the OTP memory on a device is associated with a risk for misconfiguration. The risk for human errors is present and can have unacceptable consequences. Write failures may also happen, i.e. the intended bit in the OTP memory not being written to due to hardware failure or environmental conditions.

Given the possibility for misconfiguration, there is thus a risk that the device is permanently configured in a way which disqualifies it for its intended use. In a worst-case scenario, the device can be "bricked", i.e. become completely inoperable. These risks might cause hardware owners to refrain from using OTP memories at all.

There are platform-specific ways to imitate some behavior of an OTP memory, e.g. by using debug firmware. Hardware and boot-ROM changes can, however, not be imitated. Moreover, OTP memories are intended to be programmed after manufacturing, i.e. by the end-user. One of the drivers for this is to simplify the logistics for the device manufacturer; generic chips can be sold to all customers, and later be customized by the customer himself. Hence, imitation of OTP memories requires support from one or several manufacturer components on the device such as software and firmware. Imitations of OTP memories have several limitations: no supported for hardware/Boot-ROM changes, no guarantee that the behavior of the imitation and the real OTP memory is equal, a requirement of direct support from all software/firmware affected by the OTP memory, and imitation is no longer an option when programming additional bits in the OTP memory after the device has been deployed.

Hence, there is still a need for improved OTP memory devices.

SUMMARY

An object of embodiments herein is to provide an OTP memory device addressing at least some of the issues noted above.

According to a first aspect there is presented a verifiable OTP memory device, the memory device comprising an MTP memory block and an OTP memory block for storing data, and a memory controller. The memory controller is configured to handle write requests and read requests. Each write request and read request pertains to writing data to, and reading data from, respectively, a requested position in either the MTP memory block or the OTP memory block. The memory controller is configured to, in response to the write requests, write the data to the requested position in either the MTP memory block or the OTP memory block. The memory controller is configured to, in response to the read requests, output data as combined from the requested position in the MTP memory block and the requested position in the OTP memory block, regardless if the read requests are for the MTP memory block or the OTP memory block.

According to a second aspect there is presented a method for handling a write request in a verifiable OTP memory device according to the first aspect. The method comprises receiving a write request for writing data to a requested position in either the MTP memory block or the OTP memory block. The method comprises writing the data to the requested position.

According to a third aspect there is presented a method for handling a read request in a verifiable OTP memory device according to the first aspect. The method comprises receiving a read request for reading data from a requested position in either the MTP memory block or the OTP memory block. The method comprises combining data from the requested position in the MTP memory block with data from the requested position in the OTP memory block. The method comprises outputting the combined data.

According to a fourth aspect there is presented a computer program for handling a write request in a verifiable OTP memory device according to the first aspect and/or handling a read request in a verifiable OTP memory device according to the first aspect, the computer program comprising computer program code which, when run on a verifiable OTP memory device according to the first aspect, causes the verifiable OTP memory device to perform a method according to the second aspect and/or the third aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously, these aspects provide an OTP memory device that does not suffer from the above issues.

Advantageously, the proposed OTP memory device can be tested as to how the memory device would behave with a certain configuration of the OTP memory block by applying it as a test configuration, i.e. in the MTP memory block. If the test results are satisfactory, the test configuration can be made permanent. If not, the MTP memory block can be cleared and the OTP memory device is left unchanged.

Advantageously, the proposed OTP memory device enables the risk of misconfiguration to be reduced.

Advantageously, the proposed OTP memory device enables the security benefits of using an OTP memory block to be utilized without the trade-off of risking permanent damages to the computer system utilizing the OTP memory device.

Advantageously, once the need for verification is no longer present, the proposed OTP memory device enables the MTP memory block to be detached and the OTP memory device to function as a regular bitwise write-once OTP memory. Additionally, after the detachment, it can be ensured that no further changes can be made to the OTP configuration of the OTP memory block.

Advantageously, if it is desirable to keep the verification capabilities after deployment, the proposed OTP memory device can be used with a dedicated, or protected, processor to allow for field updates. This can, for example, be a firmware update where a rollback protection mechanism (disallowing the old firmware version) is to be written to the OTP memory device. By applying the rollback protection in a test configuration first, it is possible to temporarily revoke the old firmware. This allows for a grace period where the old firmware is disabled but can be restored if the new firmware turns out to be flawed. When the new firmware is confirmed to function as intended, the test configuration can be made permanent.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there is still a need for improved OTP memory devices.

The embodiments disclosed herein therefore relate to a verifiable OTP memory device, methods performed by the verifiable OTP memory device, and a computer program product comprising code, for example in the form of a computer program, that when run on a verifiable OTP memory device, causes the verifiable OTP memory device to perform the methods.

The proposed memory device is enabled to be tested regarding how the memory device would behave with certain bits in the OTP memory being programmed, before permanently committing to such a configuration. Essentially, by combining an MTP and an OTP, a memory device with such verification capabilities is enabled. Such a memory device is denoted a verifiable OTP memory device, or but will be referred to as memory device for short unless there is any risk for confusion.

Figure 1:
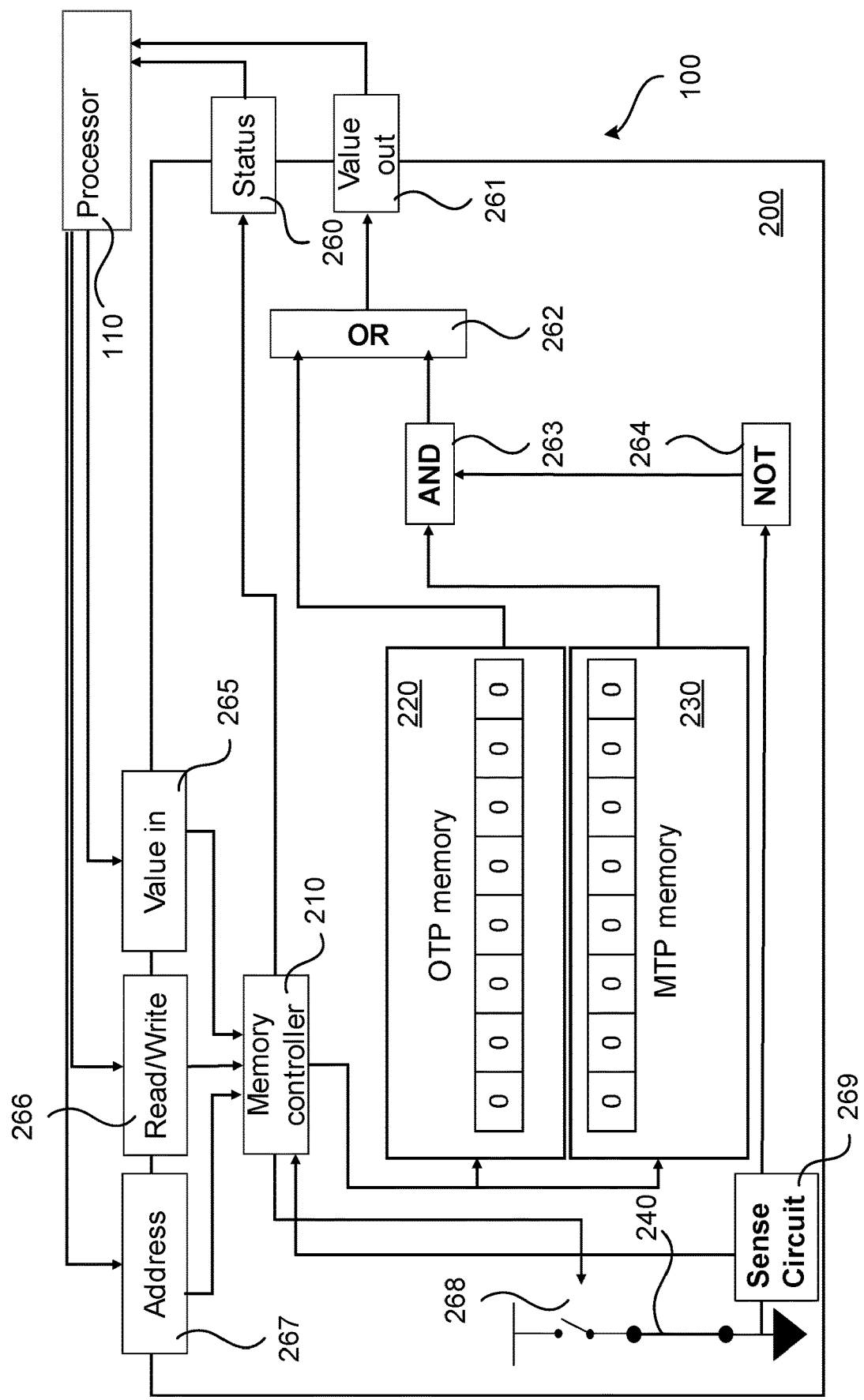
FIGS. 1-6, and 10-14 are schematic diagrams illustrating a computer system comprising a verifiable OTP memory device according to embodiments.

FIG. 1 is a schematic diagram illustrating a computer system 100 according to an embodiment. The computer system 100 comprises a processor 110 and a verifiable OTP memory device 200. In general terms, the processor 110 is configured to operate on data stored by the memory device 200. The processor 110 might take the shape of a CPU, but other variants such as FPGAs and ASICs are also possible. Details of the memory device 200 will be disclosed next.

The memory device 200 comprises an MTP memory block 230 and an OTP memory block 220 for storing data, and a memory controller 210. The memory device 200 is operatively connected to the processor 110 via ports, or interfaces, such as an address port 267, a read/write port 266, a value in port 265, a status port 260, and a value out port 261. The MTP memory block 230 and the OTP memory block 220 are operatively connected to the memory controller 210 and act on behalf of the memory controller 210. The memory controller 210 itself acts when receiving a request from the processor 110.

The OTP memory block 220 might provide storage for OTP configuration of the memory device 200. The OTP memory block 220 can be of any type, e.g. e-fuses, antifuses or an OTP EPROM. The MTP memory block 230 might provide storage for storing a test configuration of the memory device 200. Each bit in the MTP memory block 230 corresponds to a bit in the OTP memory block 220.

The memory controller 210 is configured to handle write requests and read requests. Each write request and read request pertains to writing data to, and reading data from, respectively, a requested position in either the MTP memory block 230 or the OTP memory block 220. The memory controller 210 might thus be configured to interpret and execute incoming read and write instructions (via the read/write port 266) from the processor 110.

The memory controller 210 is configured to, in response to the write requests, write the data to the requested position in either the MTP memory block 230 or the OTP memory block 220 (according to information received via the address port 267).

The memory controller 210 is configured to, in response to the read requests, output data, via the value out port 261, as combined from the requested position in the MTP memory block 230 and the requested position in the OTP memory block 220, regardless if the read requests are for the MTP memory block 230 or the OTP memory block 220.

The memory controller 210 might be implemented as software/firmware running on a dedicated processor, a bitstream on an FPGA, in pure hardware or any combination of these. Regardless of the implementation, the memory controller 210 might be configured to interpreting incoming requests arriving at the interfaces or ports of the memory device 200; via the interfaces or ports, sending an outgoing response with status code (via the status port 260), and value (via the value out port 261); reading/writing from/to both the OTP memory block 220 and the MTP memory block 230; and determining the status of and activating a detachment mechanism (as will be further disclosed below).

The state of the OTP memory block 220 might be referred as the "OTP configuration" of the memory device 200 and the state of the MTP memory block 230 might be referred to as the "test configuration". Each bit in the OTP configuration may be individually programmed at different time instances, and each bit in the OTP configuration corresponds to a respective bit in the test configuration.

A processor 110 connected to the memory device 200 can write separately to both the MTP memory block 230 and the OTP memory block 220. Although, when the processor 110 reads a bit from the memory device 200, it gets a combined response from both the MTP memory block 230 and the OTP memory block 220 (via the logic NOT gate 264, the logic AND gate 263 and the logic OR gate 262). Thus, by writing values to the MTP memory block 230, the processor 110 gets the same response as if the values had been programmed directly in the OTP memory block 220.

Embodiments relating to further details of the verifiable OTP memory device 200 will now be disclosed.

In some embodiments, the memory device 200 is configured to permanently disable writing of data to the MTP memory block 230. Further in this respect, the test configuration can be permanently disabled upon receiving a detachment signal. This could irreversibly detach the MTP memory block 230 and/or disregard the contents of the MTP memory block 230. After this point, no writes are allowed to the MTP memory block 230 and any read operation only returns a value as determined by the content of the OTP memory block 220. There could be different ways in which the writing of data to the MTP memory block 230 is permanently disabled, and thus different examples of the make permanent mechanism. Different types of the detachment mechanism, responsible for disconnecting the MTP memory block 230 when activated and in some examples for disabling any further writes to the OTP memory block 220, can thus be provided. In some examples the OTP is not write disabled by the detachment mechanism. In some examples this detachment mechanism is implemented as a standalone fuse 240, 250 together with a switch 268, 271 and a sensing circuit 269, 270 which detects burning of the fuse 240, 250. Thus, in some embodiments, writing of data to the MTP memory block 230 is permanently disabled by a fuse 240, 250 in the memory device 200 being blown. In other embodiments, the memory device 200 is configured to permanently reject read requests for the MTP memory block 230.

In some aspects, the memory device 200 is operatively connected to the processor 110 through an interface. The interface can be used by an external entity, such as the processor 110, for writing to, and reading, from the memory device 200. The interface might comprise ports for incoming signals comprising a tuple: address, value, and operation type (read/write). The interface might further comprise outgoing ports for providing a value and a status signal. The memory device 200 may e.g. be operatively connected to the processor 110 through a memory bus or a network-on-chip.

For a given bus architecture, the address part of the signal could be transferred using an address channel. The value part of the signals could be transferred using the data channels, and the operation type part of the signal could be transferred using the control bus and the status signal as a bus error signal.

In some examples the MTP memory block 230 and the OTP memory block 220 have different address ranges which uniquely define each position in respective memory. The activation of the detachment mechanism might also have its own unique address. The memory controller 210 translates these addresses to a memory type and a position.

When receiving a write operation, the memory controller 210 takes the requested value and writes it to the requested position in the requested memory block; either the MTP memory block 230 or the OTP memory block 220, as given by the address specified for the write operation. However, when executing a read operation, the requested position is read from both memory blocks 220, 230, regardless of if an MTP memory block 230 address or OTP memory block 220 address is requested. The read values from each memory block 220, 230 are sent through an OR-gate, providing a combined output, towards the processor 110. Due to the properties of an OR-gate, the MTP memory block 230 can never cause a bit in the OTP memory block 220 to be unwritten; once a bit has been written to the OTP memory block 220 (also referred to as the OTP block 220 having been programmed or configured), the corresponding bit in the combined output will be 1 during the entire lifetime of the memory device 200. The combined output value is written to the value out port and a signal indicating if the read was successful is written to the status port.

It is possible to design the memory controller 210 in such a way that both the MTP memory block 230 address and the OTP memory block 220 address are written to but only the OTP memory block 220 address are read from.

Apart from receiving requests from the processor 110 relating to read/write operations to the memory blocks 220, 230, the memory controller 210 might also take the detachment signal as input. As long as the detachment mechanisms has not been activated (e.g. the fuse has not been blown), the processor 110 is enabled to program and clear the bits in the MTP memory block 230 any number of times (by means of suitable write operations). After the detachment mechanism has been activated (e.g. by the fuse having been blown), any attempts to access the MTP memory block 230 (both for read and write operations) are disabled. Furthermore, no more writes can be made to the OTP memory block 220. Either of these requests will result in an error signal sent to the status port.

Figure 2:
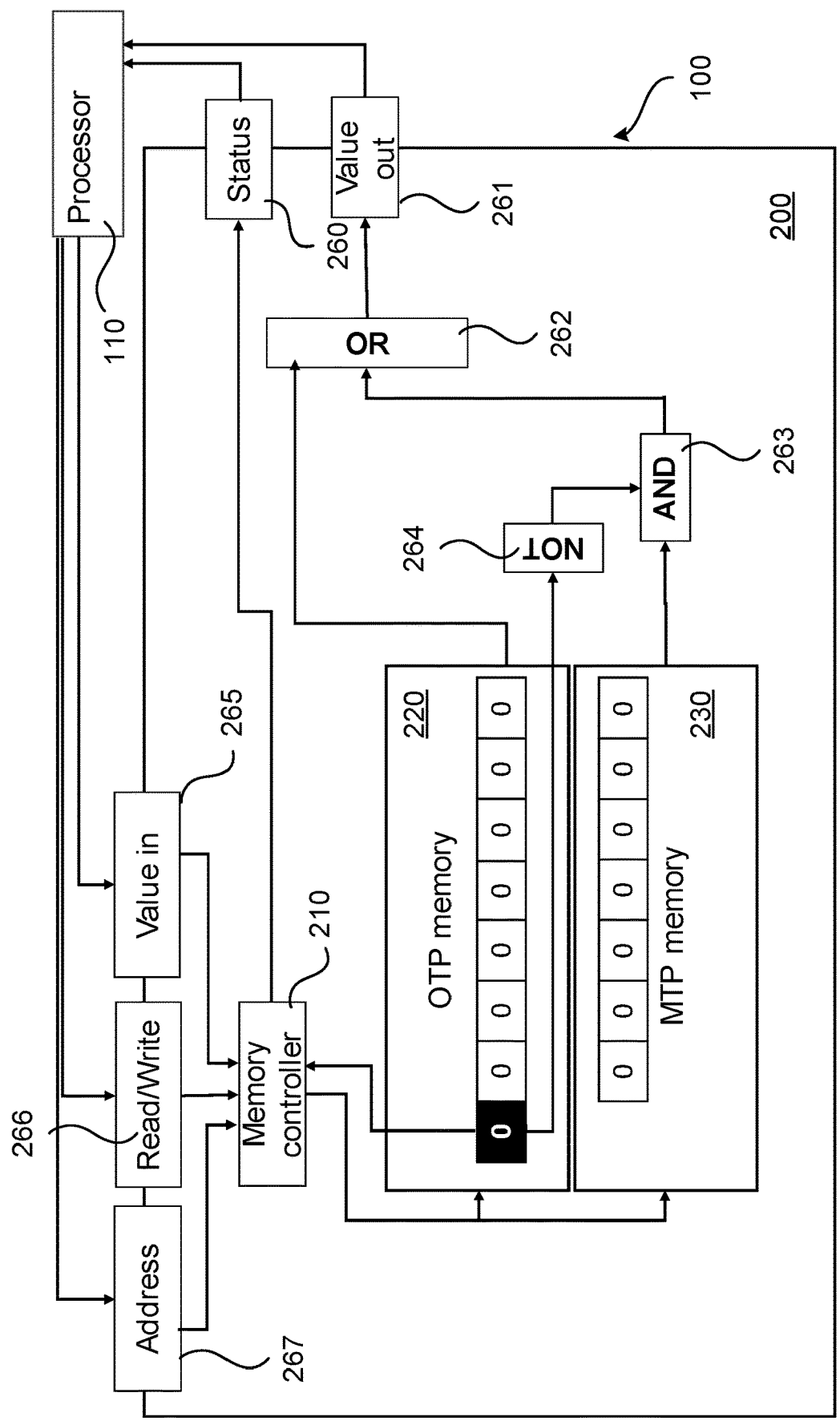

In some aspects, the detachment mechanism is part of the OTP memory block 220 itself. In some embodiments, when a control bit in the memory device 200 is set, data read from the MTP memory block 230 is set to zero before being combined with the data read from the OTP memory block 220. A computer system 100 with such a memory device 200 is illustrated in FIG. 2. The control bit in the OTP memory block 220 does not have a corresponding bit in the MTP memory block 230.

Figure 3:
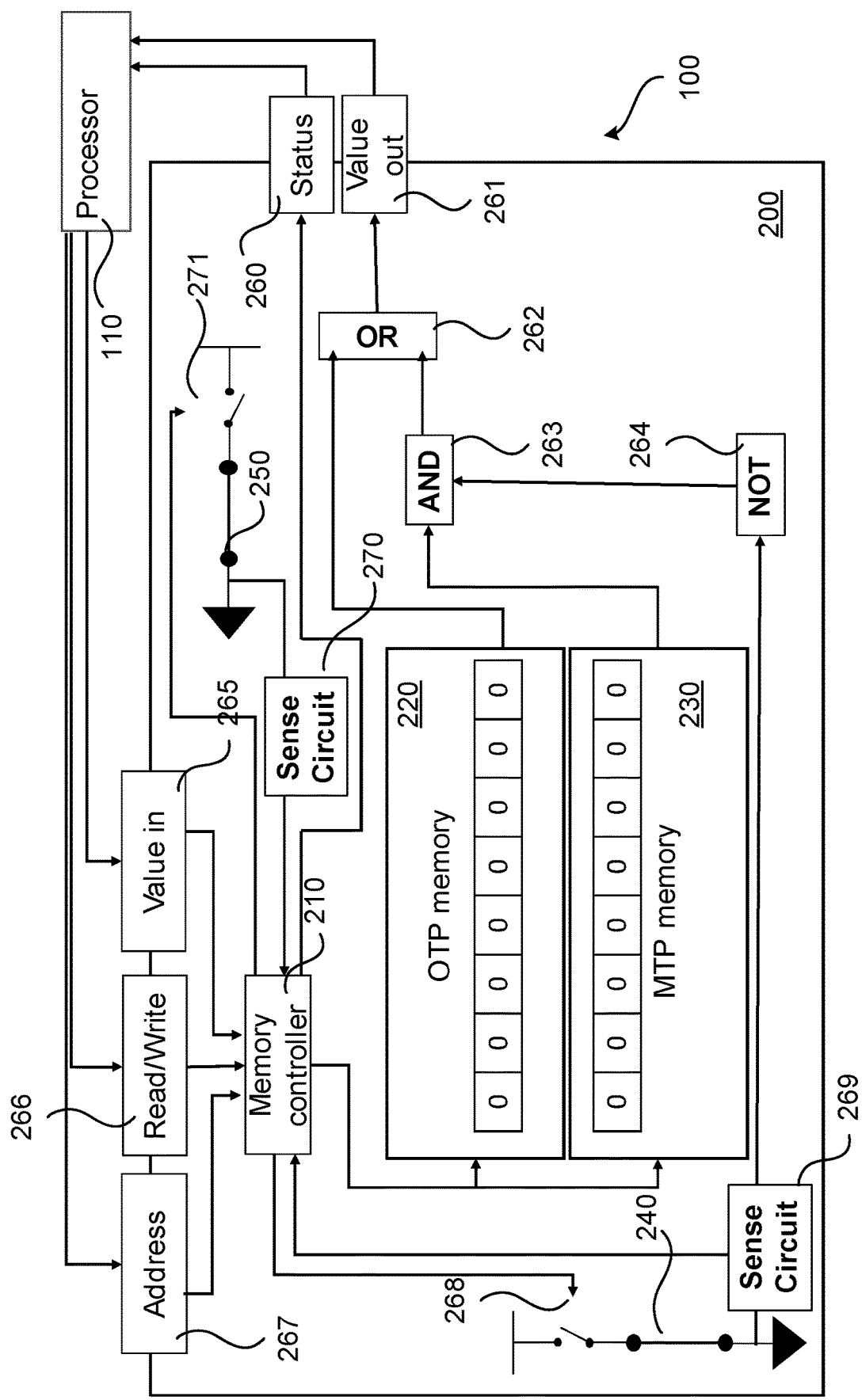
Figure 4:
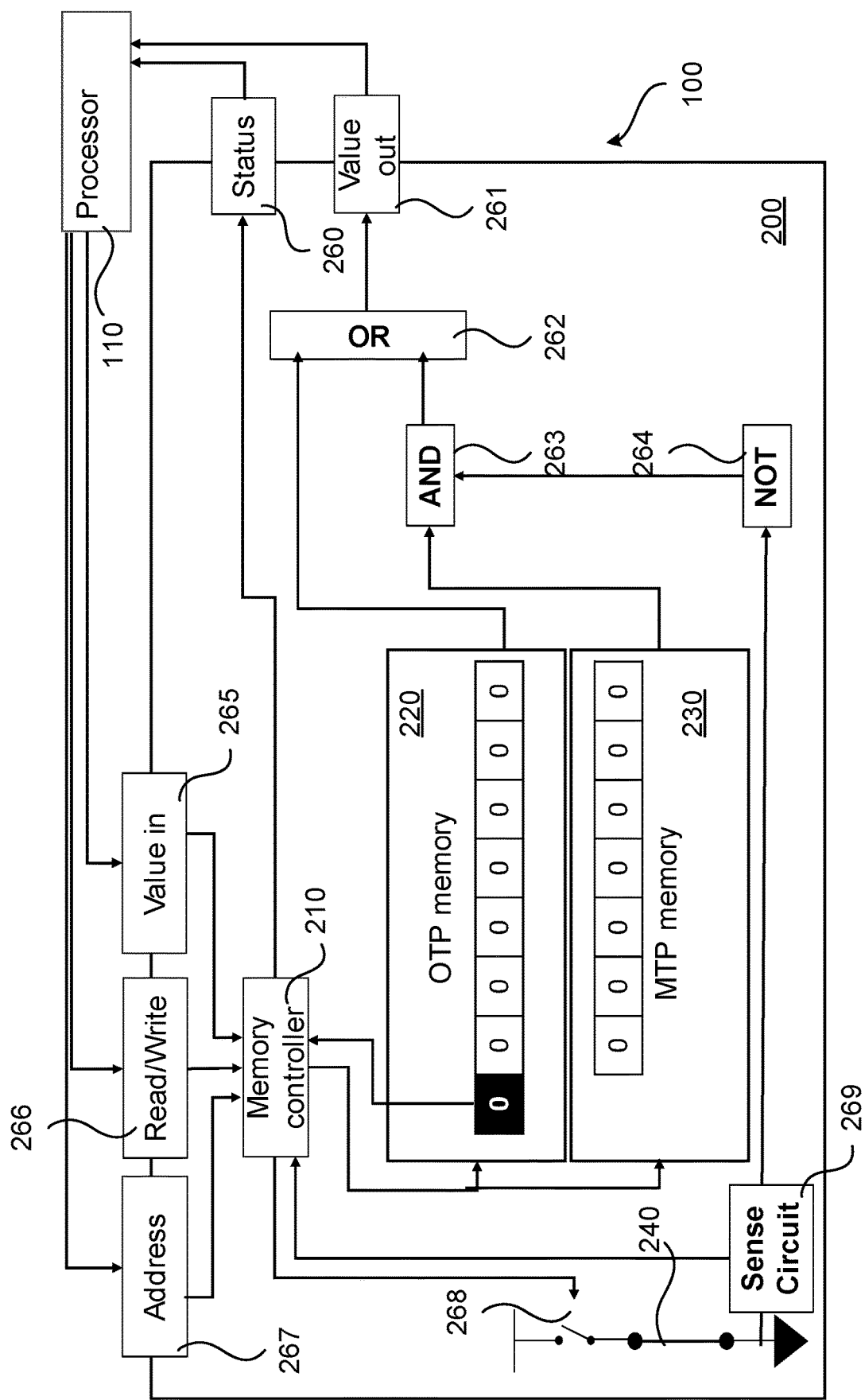

In some aspects, the detachment and write disable of the MTP memory block 230 are not treated as the same mechanism but rather as two separate mechanisms. Thus, in some embodiments, when a fuse 240 in the memory device 200 is blown, data read from the MTP memory block 230 is set to zero before being combined with the data read from the OTP memory block 220. In some embodiments, the memory device 200 is configured to permanently disable writing of data to the OTP memory block 220. This can be implemented with two dedicated fuses 240, 250 (as in the memory device 200 in the computer system 100 illustrated in FIG. 3), two OTP bits, or a combination of a dedicated fuse 240 and an OTP bit (as in the memory device 200 in the computer system 100 illustrated in FIG. 4).

Figure 5:
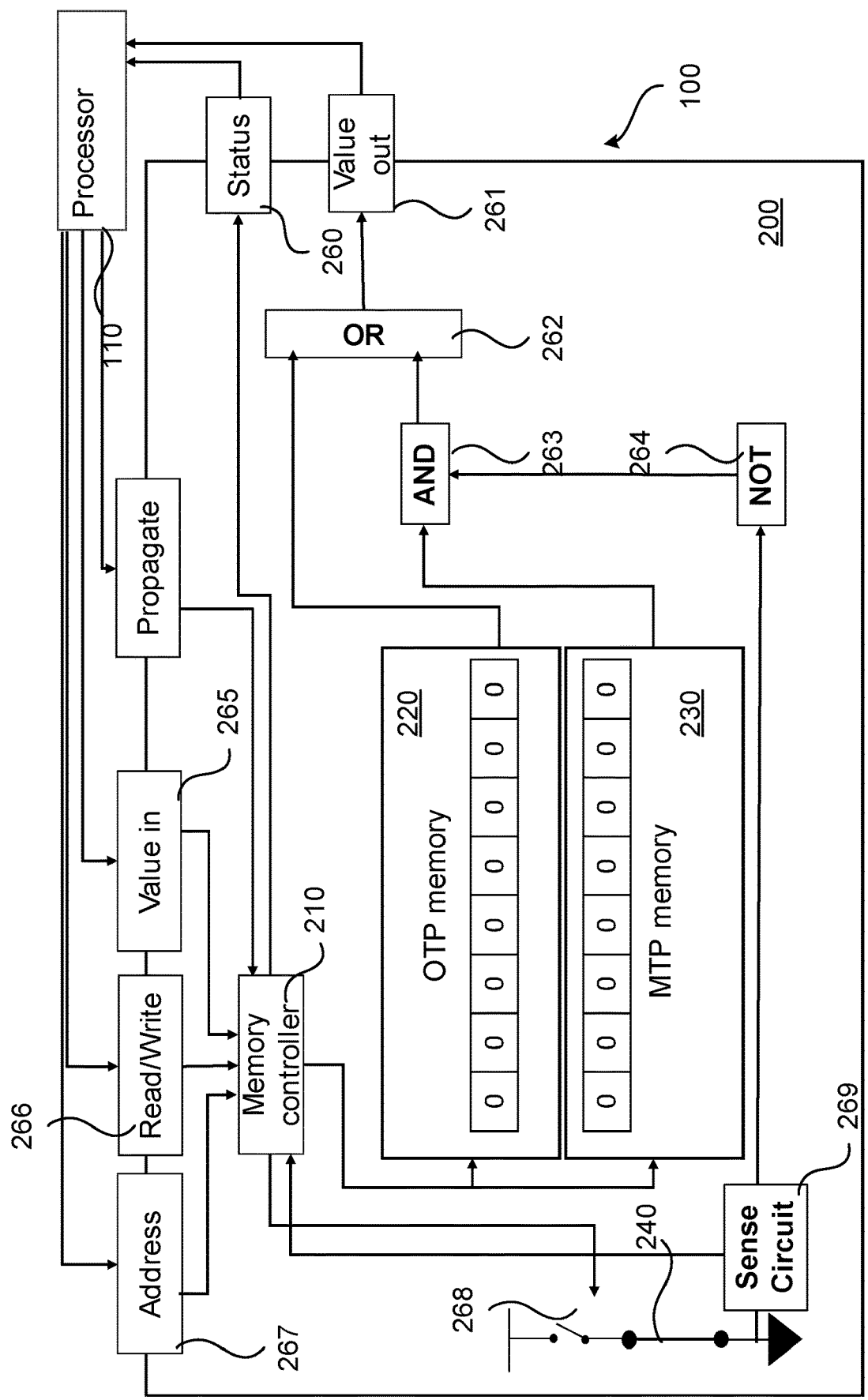

In some aspects, instead of allowing external write requests to the OTP memory block 220, a request to copy the state of the MTP memory block 230 can be used. That is, in some embodiments, any writing of data to the OTP memory block 220 involves first writing the data to the MTP memory block 230, where the written data defines a state for the MTP memory block 230, and then copying the state of the MTP memory block 230 to the OTP memory block 220. A computer system 100 with such a memory device 200 is illustrated in FIG. 5. This can be beneficial to guarantee that the values written to the OTP memory block 220 are the same as in the MTP memory block 230. A signal from the processor 110 could instruct the memory controller 210 to copy the state of the MTP memory block 230 to the OTP memory block 220.

Figure 6:
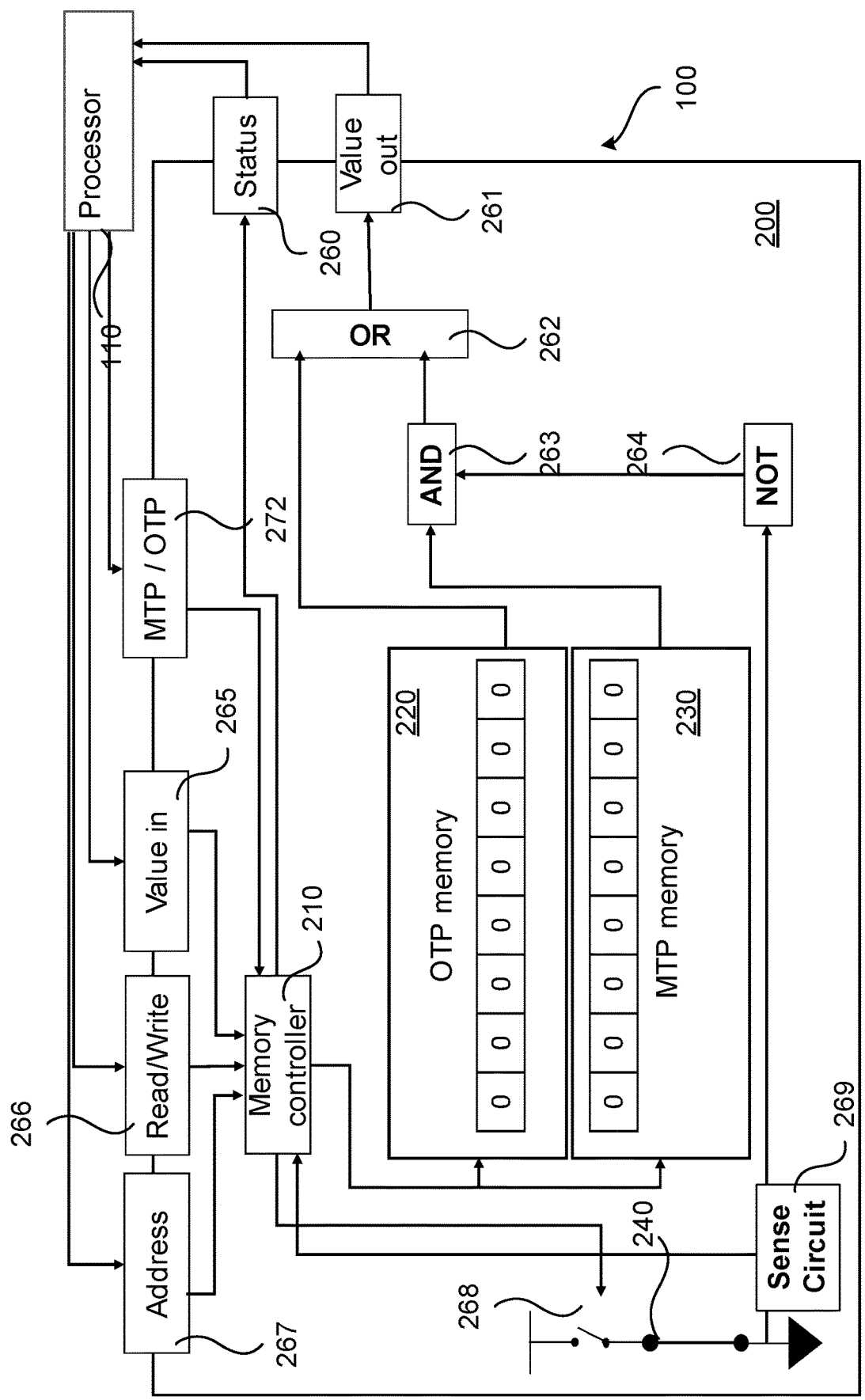

In some aspects, an alternative to having different address spaces for the OTP memory block 220 and the MTP memory block 230 is to use a signal to inform whether a write operation is to be done in a OTP configuration or a debug configuration. Thus, in some embodiments, the MTP memory block 230 and the OTP memory block 220 share a common address space, and whether the requested position in the MTP memory block 230 or in the OTP memory block 220 is defined by an indicator provided in the write requests and the read requests, respectively, to an MTP/OTP port 272. A computer system 100 with such a memory device 200 is illustrated in FIG. 6. In some embodiments, the indicator is a single bit.

In some aspects, instead of the memory controller 210 fetching the values of the MTP memory block 230 and OTP memory block 220 for each read request, the memory device 200 might comprise an internal cache where values are pre-fetched and updated after each write operation. Thus, in some embodiments, the memory device 200 further comprises a cache, and wherein the memory controller 210 is configured to write the data to, and read the data from, respectively, the MTP memory block 230 and the OTP memory block 220 via the cache. In some examples the cache is implemented as a register within the OTP memory block 220. In other examples the cache is implemented with the value out port.

Depending on the use case and security level, multiple processors 110 can be used to perform writes and reads from the memory device 200. A computer system 100 with several processors 110 may use different processors 110 to access the memory device 200. If a higher security level is needed, a single dedicated processor 110 can instead be used to communicate with the memory device 200. Such a processor 110 can, for example, require authentication or only be accessible using certain boot components.

Further, in some embodiments, the memory device 200 comprises at least two MTP memory blocks 230 and as many OTP memory blocks 220 as MTP memory blocks 230, where each MTP memory block 230 forms a pair with a respective one of the OTP memory blocks 220, and where the memory controller 210 is configured to handle write requests and read requests individually for each such pair of one MTP memory block 230 and one OTP memory block 220. Each such pair of one MTP memory block 230 and one OTP memory block 220 then has its own detachment mechanism and/or write disable mechanism. Further, one MTP memory block 230 could correspond to two or more OTP memory blocks 220 if the MTP memory block 230 has equal or more bits than the OTP memory blocks 220 combined. That is, in some embodiments the memory device 200 comprises only a single MTP memory blocks 230 but at least two OTP memory blocks 220.

There could be different types of read and write requests. In some embodiments, each write request pertains to writing one bit of data to the requested position. In some embodiments, each read request pertains to reading one bit of data from the requested position. Although one bit of data is written to, or read from, the requested position, each read/write request might refer to several positions at a time, but where one bit of data is read/written at each position.

In some embodiments, the memory controller 210 is configured to combine the read data by implementing a logic OR operation between the data as read from the MTP memory block 230 and the data as read from the OTP memory block 220. However, it is noted that although some of the operations as performed by the memory device 200 are in FIG. 1 (and also in the following figures) implemented by logic gates, such as logic OR gates, logic AND gates and logic NOT gates, these operations might also have other implementations.

Figure 7:
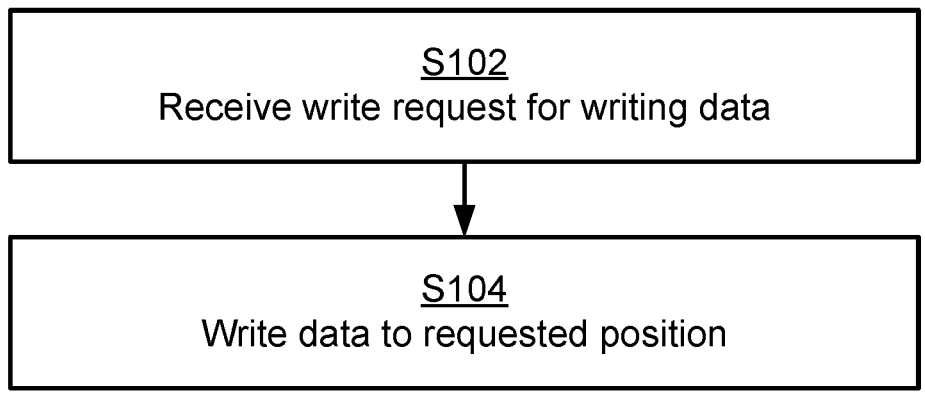
FIGS. 7, 8, 9 are flowcharts of methods according to embodiments.

FIG. 7 is a flowchart illustrating an embodiment of a method for handling a write request in a verifiable OTP memory device 200 according to any of the above embodiments. The method is performed by the verifiable OTP memory device 200 according to any of the above embodiments. The method is advantageously provided as a computer program 1720*a*.

S102: The memory device 200 receives a write request for writing data to a requested position in either the MTP memory block 230 or the OTP memory block 220. The write request might be received by the memory controller 210 from the processor 110.

S104: The memory device 200 writes the data to the requested position.

Figure 8:
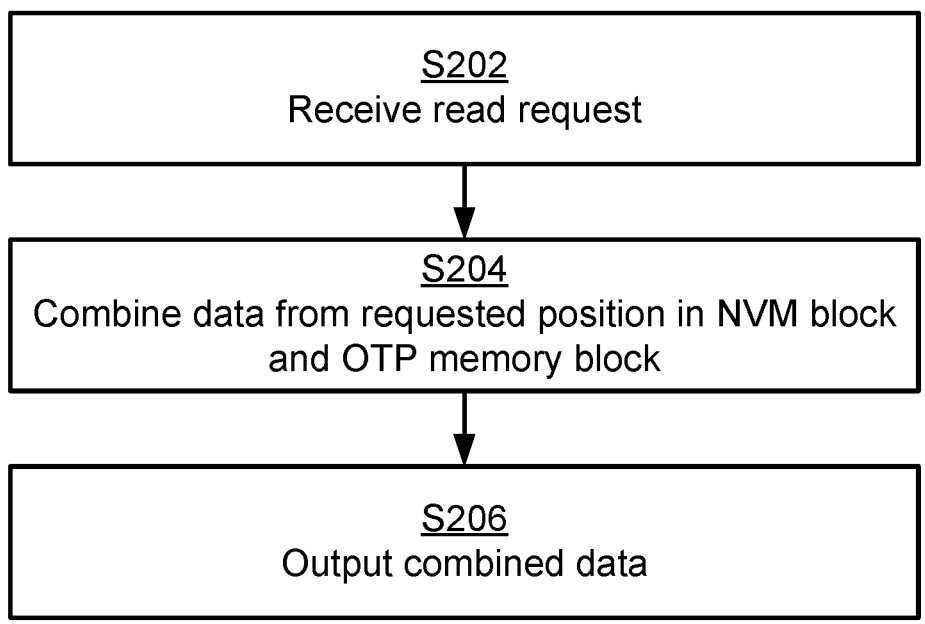

FIG. 8 is a flowchart illustrating an embodiment of a method for handling a read request in a verifiable OTP memory device 200 according to any of the above embodiments. The method is performed by the verifiable OTP memory device 200 according to any of the above embodiments. The method is advantageously provided as a computer program 1720b.

S202: The memory device 200 receives a read request for reading data from a requested position in either the MTP memory block 230 or the OTP memory block 220. The read request might be received by the memory controller 210 from the processor 110.

S204: The memory device 200 combines data from the requested position in the MTP memory block 230 with data from the requested position in the OTP memory block 220.

S206: The memory device 200 outputs the combined data. The combined data might be output to the processor 110.

Figure 9:
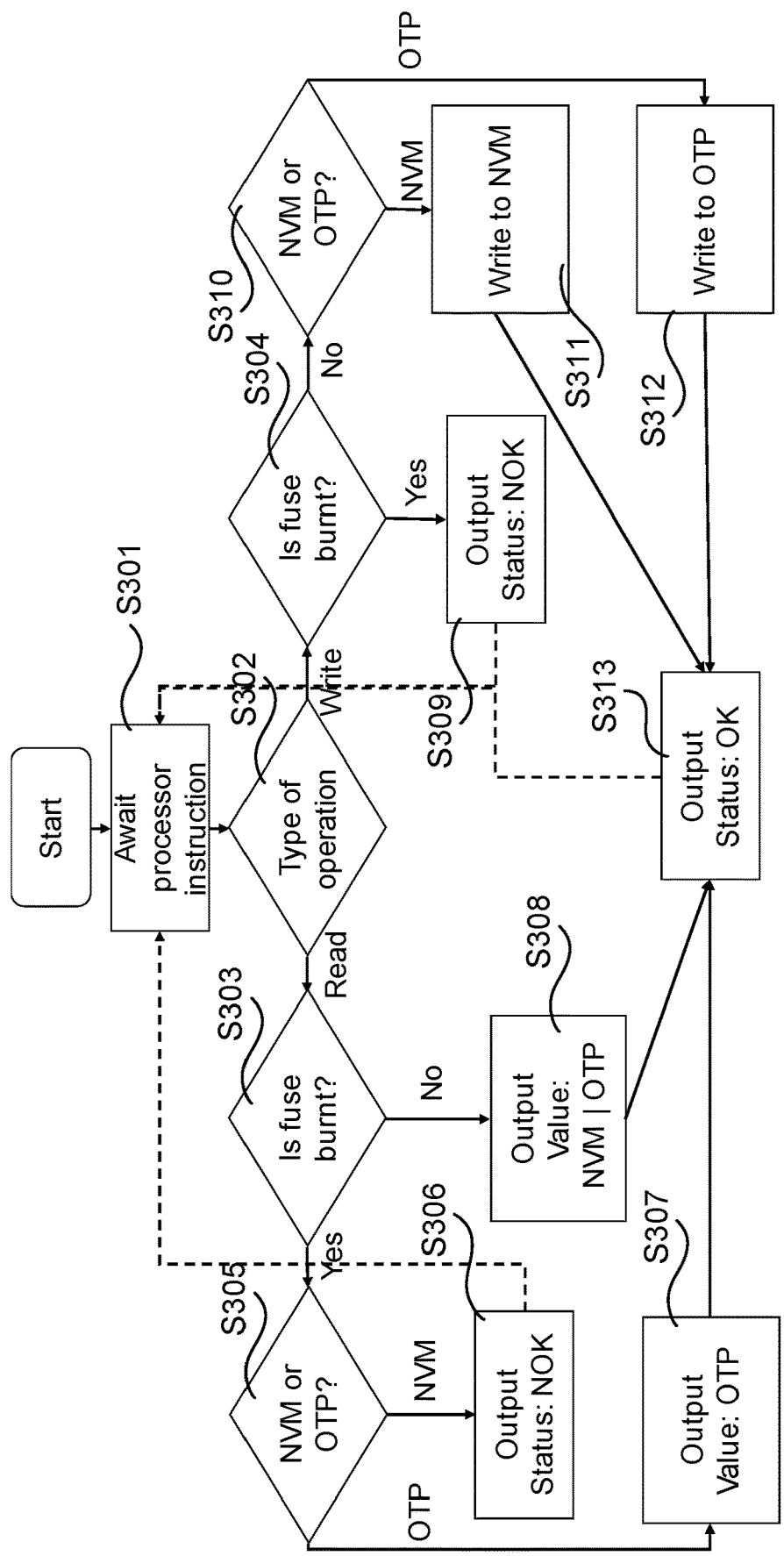

FIG. 9 is a flowchart illustrating an embodiment of a method for operating the memory device 200 according to an embodiment.

S301: The memory device 200 awaits an instruction from the processor 110.

S302: An instruction, in terms of a read operation or a write operation is received from the processor 110. If a read operation is received, step S303 is entered. If a write operation, step S304 is entered.

S303: It is checked if the detachment mechanism has been activated. If yes, step S305 Is entered. If No, step S308 is entered.

S304: It is checked if the detachment mechanism has been activated. If yes, step S309 is entered. If No, step S310 is entered.

In some embodiments, the OTP is not disabled by burning the fuse and OTP writes are thereby allowed to proceed to step S312.

S305: It is checked if the read operation is for the OTP memory block 220 or the MTP memory block 230. If the read operation is for the MTP memory block 230, step S306 is entered. If the read operation is for the OTP memory block 220, step S307 is entered.

S306: The output status is set to not ok. A return is then made back to step S301 for awaiting a further instruction from the processor 110.

S307: The output value is set to the value of the OTP memory block 220.

S308: The output value is set to the combination of the value of the OTP memory block 220 and the value of the MTP memory block 230.

S309: The output status is set to not ok. A return is then made back to step S301 for awaiting a further instruction from the processor 110.

S310: It is checked if the write operation is for the OTP memory block 220 or the MTP memory block 230. If the write operation is for the MTP memory block 230, step S311 is entered. If the write operation is for the OTP memory block 220, step S312 is entered.

S311: A write is made to the position in the MTP memory block 230 as given by the address provided by the processor 110.

S312: A write is made to the position in the OTP memory block 220 as given by the address provided by the processor 110

S313: The output status is set to ok. A return is then made back to step S301 for awaiting a further instruction from the processor 110

Some use cases will be shown in the below examples. All values to and from the memory device 200 are written in binary representation. The initial states of the OTP memory block 220 and the MTP memory block 230 are shown in FIG. 1 and it is for illustrative purposes assumed that the MTP memory block 230 consist of a memory where each address corresponds to a storage location containing a byte (8 bits). In these examples one storage location in the MTP memory block 230 is defined by address A and one storage location in the OTP memory block 220 is defined by address B. Each bit in address A correspond to one bit in address B. The address of activating the detachment mechanism is address C. It is understood that in a real implementation, the MTP memory block 230 and the OTP memory block 220 will contain several different addresses and that the memory device 200 might comprise more than one memory region per memory type.

Example 1: Initial State

Figure 10:
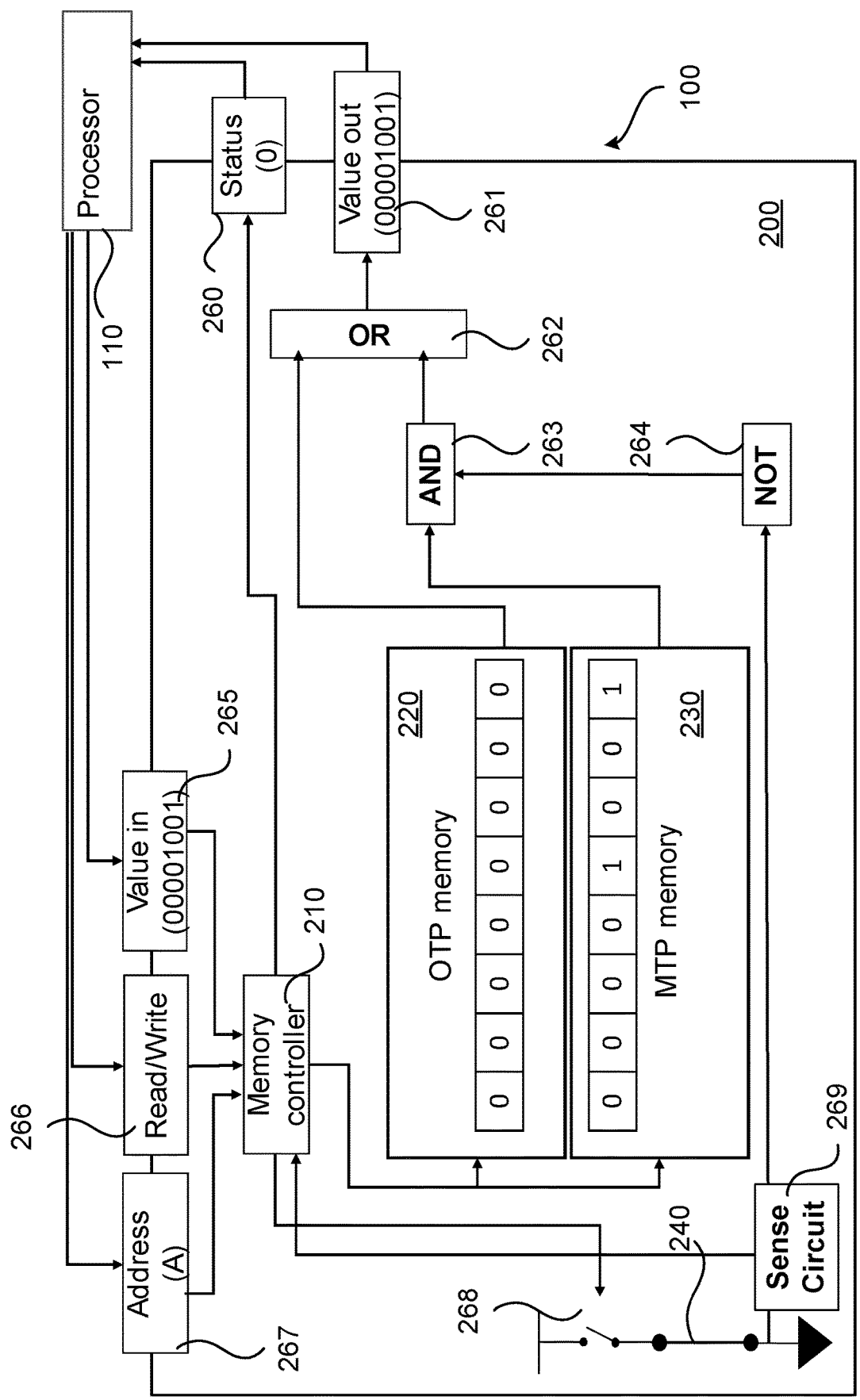

The memory device 200 is in its initial state; no bits have been written in either memory blocks 220, 230. The processor 110 sends a request to write 00001001 to address A. The memory controller 210 receives this request, translates address A to positions 0 to 7 in MTP memory block 230, writes 00001001 to the corresponding MTP memory block 230 bits and sends 0, indicating success, to the status port. The new state of the memory device 200 is depicted in FIG. 10.

The processor 110 sends a request to read from address B. The memory controller 210 receives this request, translates address B to positions 0 to 7 in OTP memory block 220 and sends a request to both memory blocks 220, 230 to output the values in positions 0 to 7. 00000000 (OTP memory block 220 response) and 00001001 (MTP memory block 230 response) are sent through an OR-gate, resulting in the value 00001001. The value 00001001 is written to the value out port. The memory controller 210 sends 0, indicating success, to the status port.

Example 2: Writing to OTP Memory Block 220 and Clearing MTP Memory Block 230

The test configuration from example 1 is assumed to having been successfully tested and will now be programmed into OTP memory block 220 memory. The starting point is the state in FIG. 10.

The processor 110 sends a request to write 00001001 to address B. The memory controller 210 receives this request, translates address B to positions 0 to 7 in OTP memory block 220, writes 00001001 to these bits of the OTP memory block 220 and sends 0, indicating success, to the status port. The processor 110 sends a request to read from address B. The memory controller 210 receives this request, translates address B to positions 0 to 7 in OTP memory block 220 and sends a request to both memory blocks 220, 230 to output the values in positions 0 to 7. The value 00001001 (OTP memory block 220 response) and the value 00001001 (MTP memory block 230 response) are sent through an OR-gate, resulting in 00001001. The value 00001001 is written to the value out port. The memory controller 210 sends 0, indicating success, to the status port.

Figure 11:
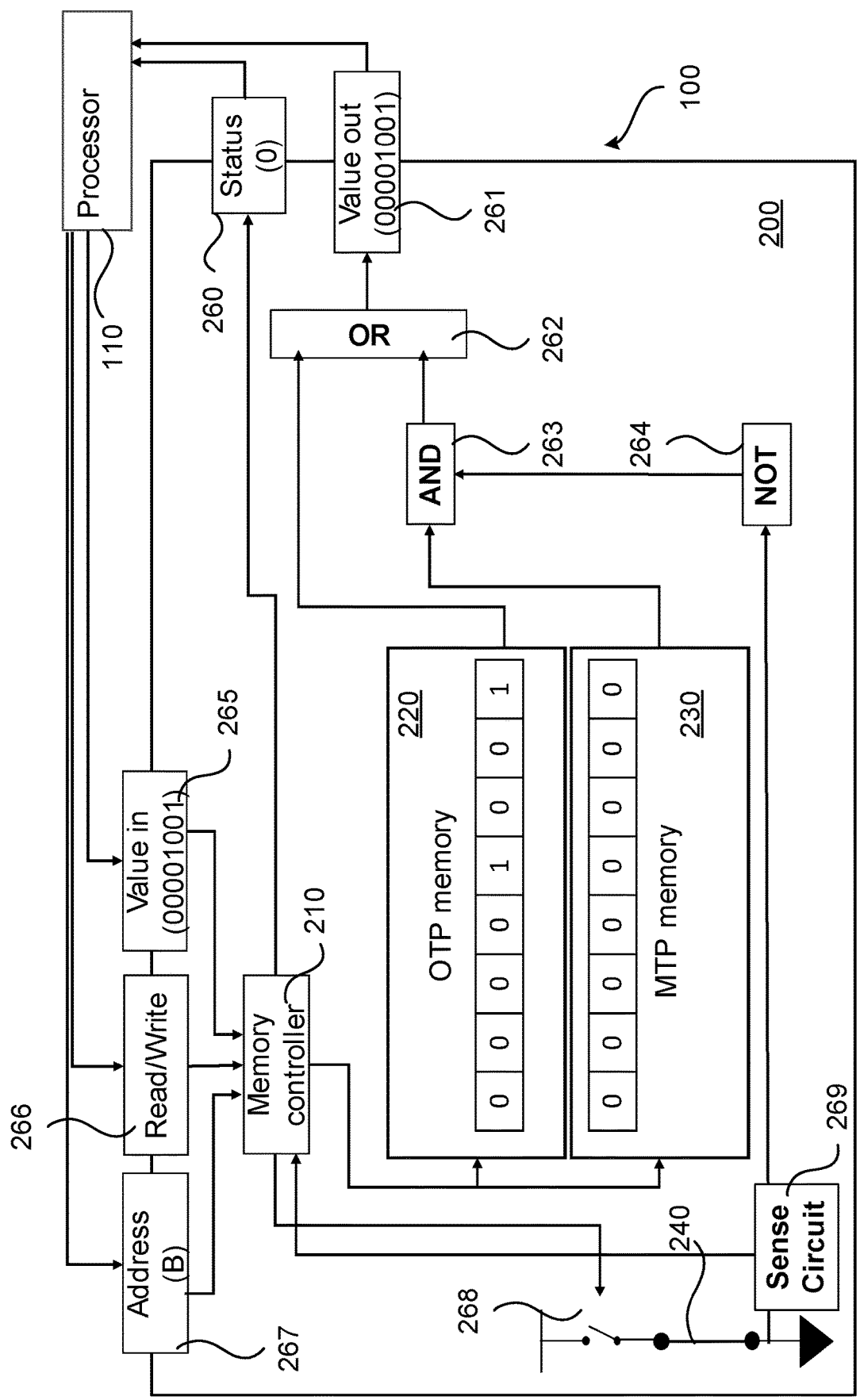

The processor 110 sends a request to write 00000000 to address A. The memory controller 210 receives this request, translates address A to positions 0 to 7 in MTP memory block 230, writes 00000000 in the corresponding MTP memory block 230 bits and sends 0, indicating success, to the status port. The processor 110 sends a request to read from address B. The memory controller 210 receives this request, translates address B to positions 0 to 7 in OTP memory block 220 and sends a request to both memory blocks 220, 230 to output the values in positions 0 to 7. The value 00001001 (OTP memory block 220 response) and the value 00000000 (MTP memory block 230 response) are sent through an OR-gate, resulting in 00001001. The value 00001001 is written to the value out port. The new state of the memory device 200 is depicted in FIG. 11.

Example 3: An Additional Write

It is assumed that the OTP memory block 220 configuration at the end of example 2 has been deployed but not yet been made permanent. It is further assumed that an addition to this OTP memory block 220 configuration now is to be tested. The starting point is the state in FIG. 11.

Figure 12:
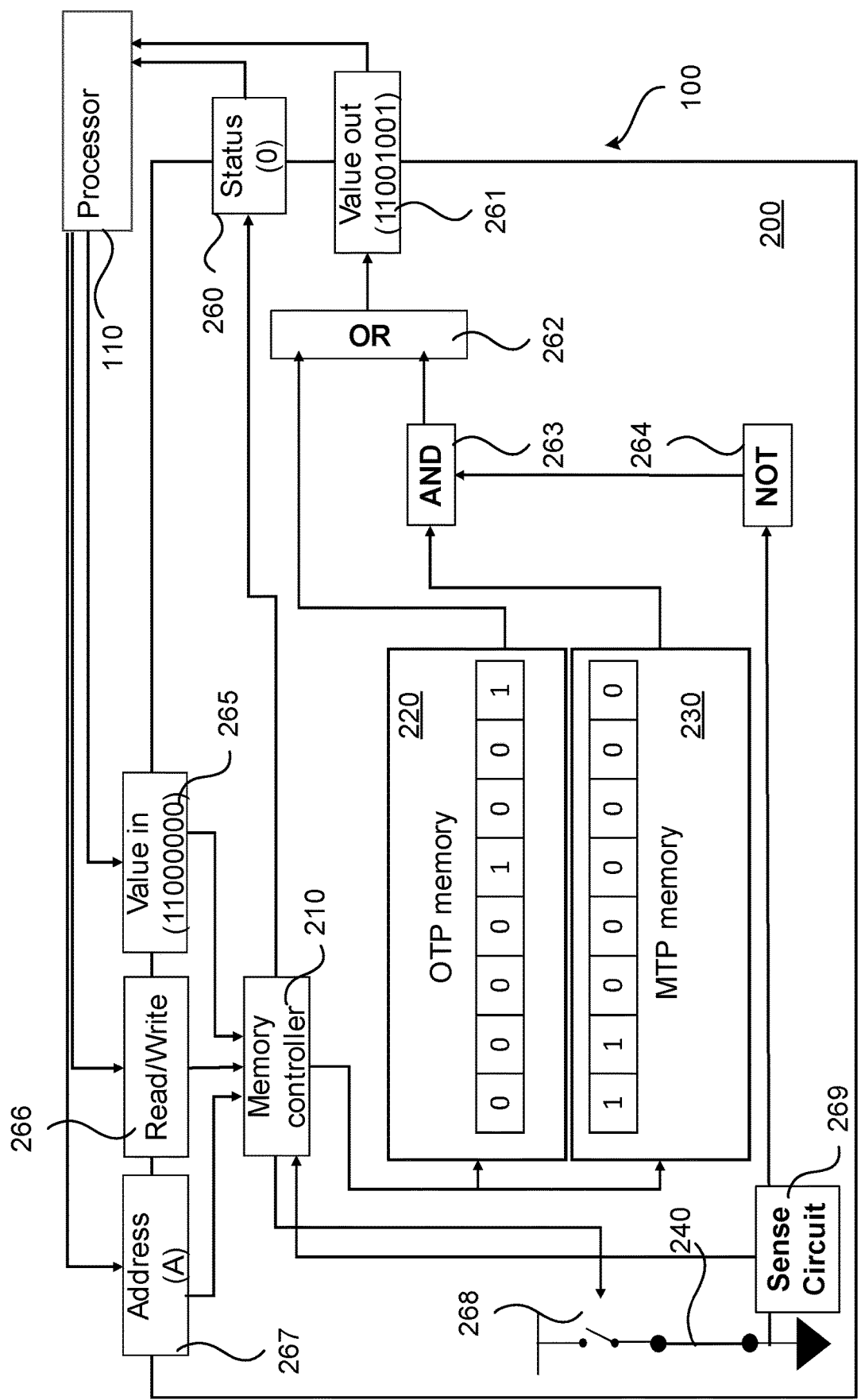

The processor 110 sends a request to write 11000000 to address A. The memory controller 210 receives this request, translates address A to positions 0 to 7 in MTP memory block 230, writes 11000000 in the corresponding MTP memory block 230 bits and sends 0, indicating success, to the status port. The processor 110 sends a request to read from address B. The memory controller 210 receives this request, translates address B to positions 0 to 7 in OTP memory block 220 and sends a request to both memory blocks 220, 230 to output the values in positions 0 to 7. The value 00001001 (OTP memory block 220 response) and the value 11000000 (MTP memory block 230 response) are sent through an OR-gate, resulting in 11001001. The value 11001001 is written to the value out port. The memory controller 210 sends 0, indicating success, to the status port. The new state of the memory device 200 is depicted in FIG. 12.

Example 4: Detaching MTP Memory Block 230

It is assumed that the test configuration in example 3 was not functioning properly. For example, the effect of having this configuration was not satisfactory. The configuration made in example 3 is therefore to be removed. Furthermore, it is assumed that no more writes should be allowed. As the MTP memory block 230 thus is to be detached, it does not need to be cleared to remove the latest-most test configuration. The starting point is the state in FIG. 12.

The processor 110 sends a request to write 1 to address C. The memory controller 210 receives this request, translates address C to activation of the detachment mechanism, sends a signal to the detachment fuse 240, which is blown. The fuse now returns value 1 and outputs value 0 (as it passes a NOT gate) to the AND gate connecting the fuse and the MTP memory block 230. The MTP memory block 230 will from this point only provide all zeros to the OR-gate. Finally, the memory controller 210 sends 0, indicating success, to the status port.

The processor 110 sends a request to read to address B. The memory controller 210 receives this request, translates address B to positions 0 to 7 in OTP memory block 220 and sends a request to both memory blocks 220, 230 to output the values in positions 0 to 7. The value 00001001 (OTP memory block 220 response) and the value 00000000 (MTP memory block 230 response) are sent through an OR-gate, resulting in 00001001. The value 00001001 is written to the value out port. The new state of the memory device 200 is depicted in FIG. 13.

Example 5: Illegal MTP Memory Block 220 Write

Figure 13:
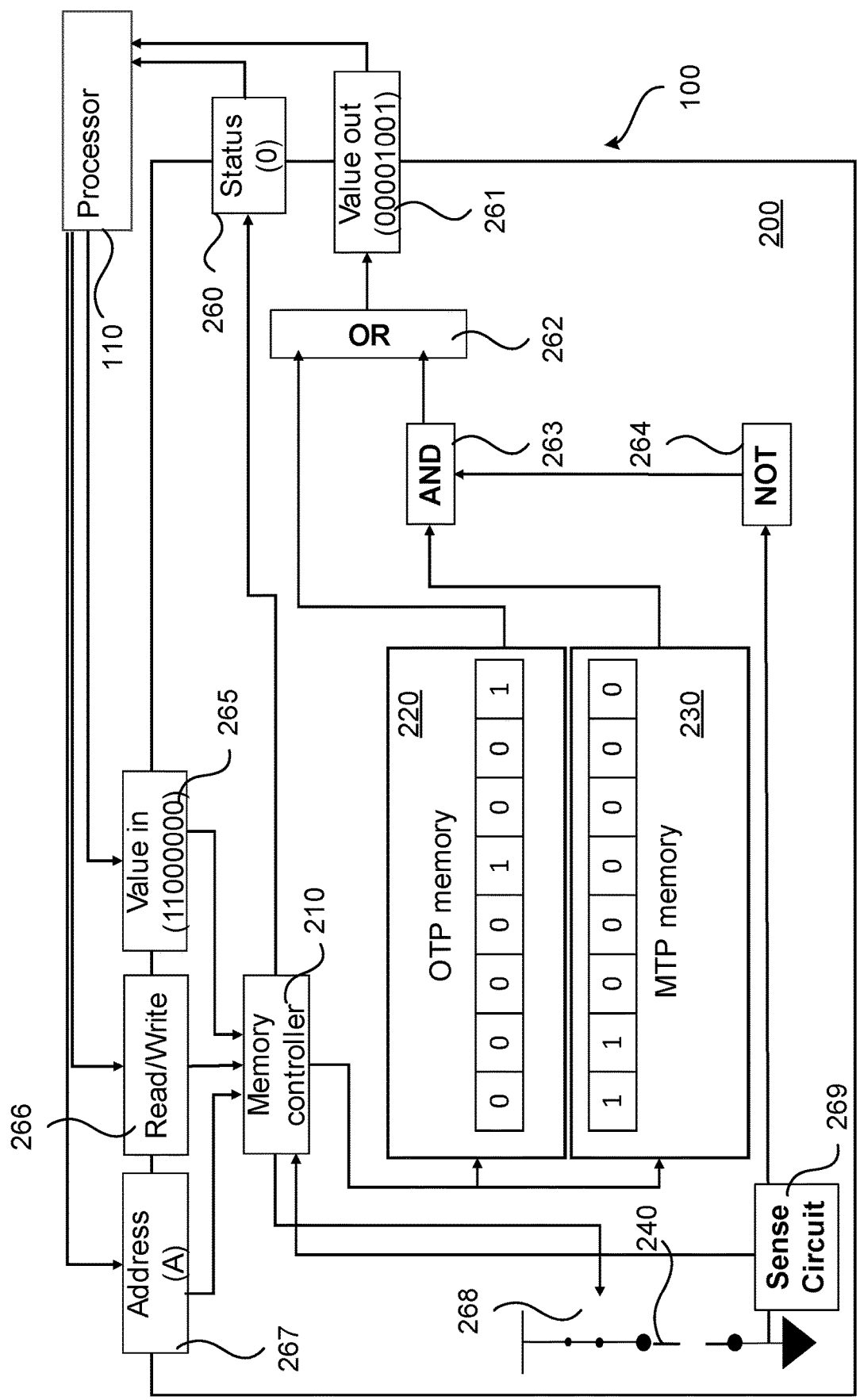
Figure 14:
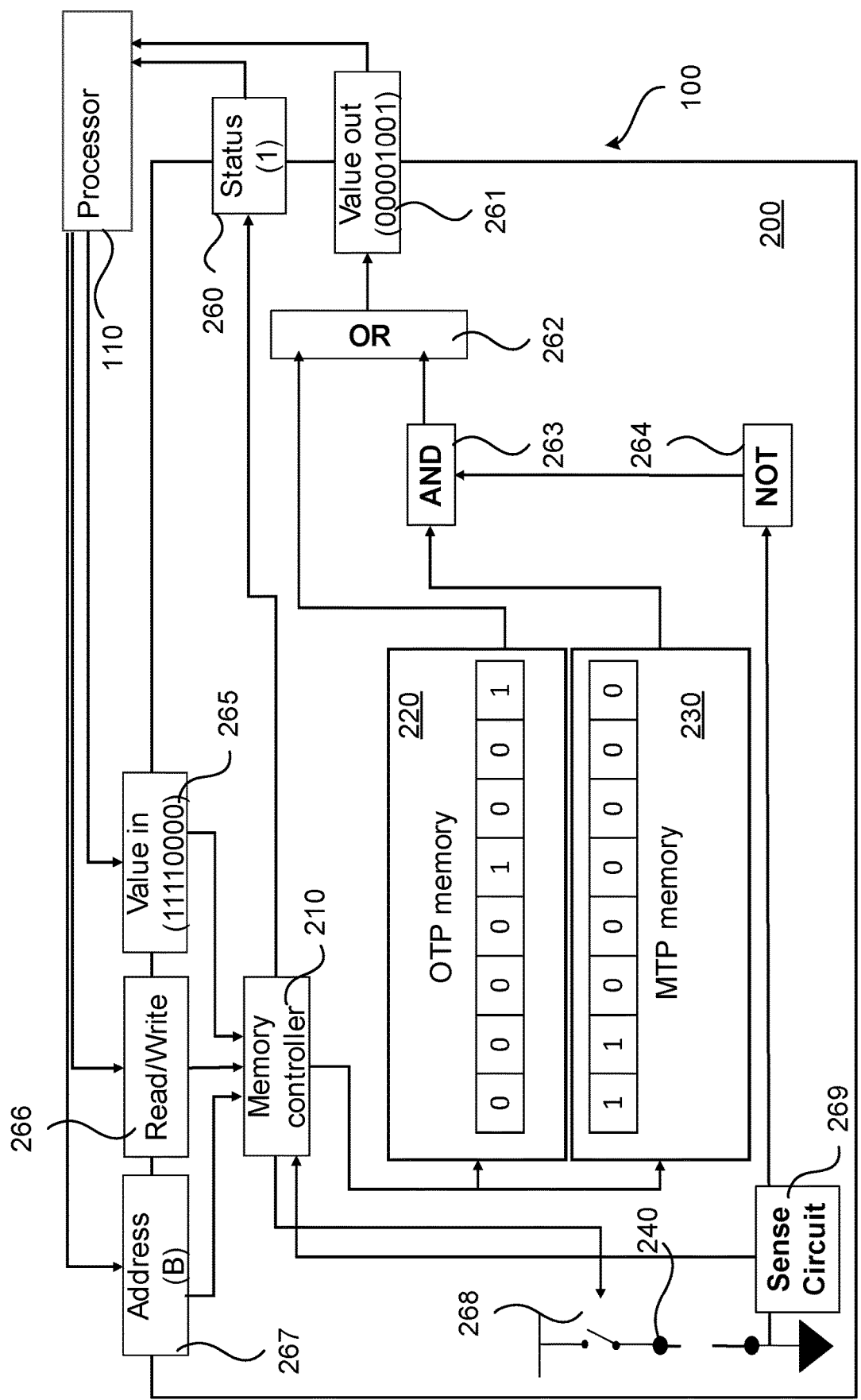

The starting point is the state in FIG. 13. The processor 110 sends a request to write 11110000 to address A. The memory controller 210 receives this request, translates address A to positions 0 to 7 in MTP memory block 220. All write operations have been disabled as the detachment fuse 240 has been blown. The write operation is disallowed. The memory controller 210 sends 1, indicating failure, to the status port. The new state of the memory device 200 is depicted in FIG. 14.

Figure 15:
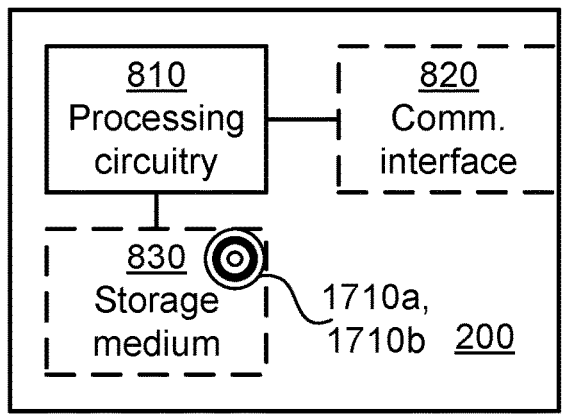
FIG. 15 is a schematic diagram showing functional units of a verifiable OTP memory device according to an embodiment.

FIG. 15 schematically illustrates, in terms of a number of functional units, the components of a verifiable OTP memory device 200 according to an embodiment. Processing circuitry 810 is provided using any combination of one or more of a suitable central processing unit (CPU), multi-processor, microcontroller, digital signal processor (DSP), etc., capable of executing software instructions stored in a computer program product 1710*a*, 1710*b* (as in FIG. 17), e.g. in the form of a storage medium 830. The processing circuitry 810 may further be provided as at least one application specific integrated circuit (ASIC), or field programmable gate array (FPGA).

Particularly, the processing circuitry 810 is configured to cause the verifiable OTP memory device 200 to perform a set of operations, or steps, as disclosed above. For example, the storage medium 830 may store the set of operations, and the processing circuitry 810 may be configured to retrieve the set of operations from the storage medium 830 to cause the verifiable OTP memory device 200 to perform the set of operations. The set of operations may be provided as a set of executable instructions.

Thus the processing circuitry 810 is thereby arranged to execute methods as herein disclosed. The storage medium 830 may also comprise persistent storage, which, for example, can be any single one or combination of magnetic memory, optical memory, solid state memory or even remotely mounted memory. The verifiable OTP memory device 200 may further comprise a communications interface 820 at least configured for communications with other entities, functions, nodes, and devices, such as the processor 110. As such the communications interface 820 may comprise one or more transmitters and receivers, comprising analogue and digital components. The processing circuitry 810 controls the general operation of the verifiable OTP memory device 200 e.g. by sending data and control signals to the communications interface 820 and the storage medium 830, by receiving data and reports from the communications interface 820, and by retrieving data and instructions from the storage medium 830. Other components, as well as the related functionality, of the verifiable OTP memory device 200 are omitted in order not to obscure the concepts presented herein.

Figure 16:
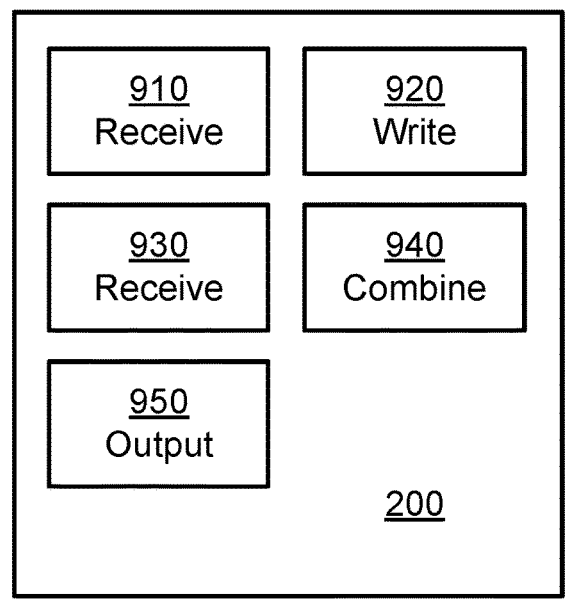
FIG. 16 is a schematic diagram showing functional modules of a verifiable OTP memory device according to an embodiment.

FIG. 16 schematically illustrates, in terms of a number of functional modules, the components of a verifiable OTP memory device 200 according to an embodiment. The verifiable OTP memory device 200 of FIG. 16 comprises a number of functional modules; a receive module 910 configured to perform step S102, a write module 920 configured to perform step S104, a receive module 930 configured to perform step S202, a combine module 940 configured to perform step S204, and an output module 950 configured to perform step S206. The verifiable OTP memory device 200 of FIG. 16 may further comprise a number of optional functional modules. In general terms, each functional module 910-950 may in one embodiment be implemented only in hardware and in another embodiment with the help of software, i.e., the latter embodiment having computer program instructions stored on the storage medium 830 which when run on the processing circuitry makes the verifiable OTP memory device 200 perform the corresponding steps mentioned above in conjunction with FIG. 16. It should also be mentioned that even though the modules correspond to parts of a computer program, they do not need to be separate modules therein, but the way in which they are implemented in software is dependent on the programming language used. Preferably, one or more or all functional modules 910-950 may be implemented by the processing circuitry 810, possibly in cooperation with the communications interface 820 and/or the storage medium 830. The processing circuitry 810 may thus be configured to from the storage medium 830 fetch instructions as provided by a functional module 910-950 and to execute these instructions, thereby performing any steps as disclosed herein.

The verifiable OTP memory device 200 may be provided as a standalone device or as a part of at least one further device. For example, the verifiable OTP memory device 200 may be provided in the computer system 100 of FIG. 1.

Figure 17:
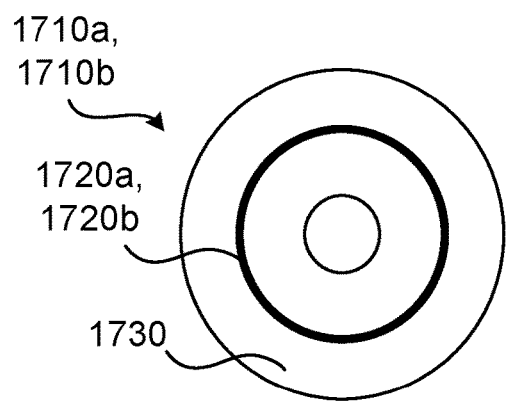
FIG. 17 shows one example of a computer program product comprising computer readable storage medium according to an embodiment.

FIG. 17 shows one example of a computer program product 1710a, 1710b comprising computer readable storage medium 1730. On this computer readable storage medium 1730, a computer program 1720a, 1720b can be stored, which computer program 1720a, 1720b can cause the processing circuitry 810 and thereto operatively coupled entities and devices, such as the communications interface 820 and the storage medium 830, to execute methods according to embodiments described herein. The computer program 1720a, 1720b and/or computer program product 1710a, 1710b may thus provide means for performing any steps as herein disclosed.

In the example of FIG. 17, the computer program product 1710a, 1710b is illustrated as an optical disc, such as a CD (compact disc) or a DVD (digital versatile disc) or a Blu-Ray disc. The computer program product 1710a, 1710b could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1720a, 1720b is here schematically shown as a track on the depicted optical disk, the computer program 1720a, 1720b can be stored in any way which is suitable for the computer program product 1710a, 1710b.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A verifiable one-time programmable, OTP, memory device, the memory device comprising a multiple-time programmable, MTP, memory block and an OTP memory block for storing data, and a memory controller, wherein the memory controller is configured to:
   handle write requests and read requests, wherein each write request and read request pertains to writing data to, and reading data from, respectively, a requested position in either the MTP memory block or the OTP memory block,
   in response to the write requests, write the data to the requested position in either the MTP memory block or the OTP memory block, and
   in response to the read requests, output data as combined from the requested position in the MTP memory block and the requested position in the OTP memory block, regardless if the read requests are for the MTP memory block or the OTP memory block.

2. The memory device according to claim 1, wherein the memory device is configured to permanently disable writing of data to the MTP memory block.

3. The memory device according to claim 1, wherein writing of data to the MTP memory block is permanently disabled by a fuse in the memory device being blown.

4. The memory device according to claim 1, wherein the memory device is configured to permanently reject read requests for the MTP memory block.

5. The memory device according to claim 1, wherein when a control bit in the memory device is set, data read from the MTP memory block is set to zero before being combined with the data read from the OTP memory block.

6. The memory device according to claim 1, wherein when a fuse in the memory device is blown, data read from the MTP memory block is set to zero before being combined with the data read from the OTP memory block.

7. The memory device according to claim 1, wherein the memory device is configured to permanently disable writing of data to the OTP memory block.

8. The memory device according to claim 1, wherein any writing of data to the OTP memory block involves first writing the data to the MTP memory block, where the written data defines a state for the MTP memory block, and then copying the state of the MTP memory block to the OTP memory block.

9. The memory device according to claim 1, wherein the MTP memory block and the OTP memory block share a common address space, and whether the requested position in the MTP memory block or in the OTP memory block is defined by an indicator provided in the write requests and the read requests, respectively.

10. The memory device according to claim 9, wherein the indicator is a single bit.

11. The memory device according to claim 1, wherein the memory device further comprises a cache, and wherein the memory controller is configured to write the data to, and read the data from, respectively, the MTP memory block and the OTP memory block via the cache.

12. The memory device according to claim 1, wherein the memory device comprises at least two MTP memory blocks and as many OTP memory blocks as MTP memory blocks, where each MTP memory block forms a pair with a respective one of the OTP memory blocks, and where the memory controller is configured to handle write requests and read requests individually for each such pair of one MTP memory block and one OTP memory block.

13. The memory device according to claim 1, wherein each write request pertains to writing one bit of data to the requested position.

14. The memory device according to claim 1, wherein each read request pertains to reading one bit of data from the requested position.

15. The memory device according to claim 1, wherein the memory controller is configured to combine the read data by implementing a logic OR operation between the data as read from the MTP memory block and the data as read from the OTP memory block.

16. A method for handling a write request in a verifiable one-time programmable, OTP, memory device according to claim 1, the method comprising:
   receiving a write request for writing data to a requested position in either the MTP memory block or the OTP memory block; and
   writing the data to the requested position.

17. A method for handling a read request in a verifiable one-time programmable, OTP, memory device according to claim 1, the method comprising:
- receiving a read request for reading data from a requested position in either the MTP memory block or the OTP memory block;
- combining data from the requested position in the MTP memory block with data from the requested position in the OTP memory block; and
- outputting the combined data.

* * * * *